United States Patent
Su

(10) Patent No.: US 8,164,972 B1
(45) Date of Patent: *Apr. 24, 2012

(54) ADDRESS DECODER

(75) Inventor: Jason T. Su, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/960,804

(22) Filed: Dec. 6, 2010

Related U.S. Application Data

(63) Continuation of application No. 11/873,505, filed on Oct. 17, 2007, now Pat. No. 7,848,173.

(60) Provisional application No. 60/829,776, filed on Oct. 17, 2006.

(51) Int. Cl.
*G11C 8/00* (2006.01)

(52) U.S. Cl. ............... 365/230.08; 365/189.08; 365/233

(58) Field of Classification Search ............. 365/230.06, 365/189.08, 233, 230.08
See application file for complete search history.

(56) References Cited

U.S. PATENT DOCUMENTS

| | | | |
|---|---|---|---|
| 4,086,500 A | 4/1978 | Suzuki et al. | |
| 4,401,903 A | 8/1983 | Iizuka | |
| 4,488,266 A | 12/1984 | Spence | |
| 5,291,076 A | 3/1994 | Bridges et al. | |
| 5,311,479 A | 5/1994 | Harada | |
| 5,373,203 A | 12/1994 | Nicholes et al. | |
| 5,640,108 A | 6/1997 | Miller | |
| 6,373,752 B1 * | 4/2002 | Wright et al. | 365/189.05 |
| 6,445,640 B1 | 9/2002 | Gold | |
| 6,677,782 B2 | 1/2004 | Kanetani et al. | |
| 7,848,173 B1 * | 12/2010 | Su | 365/230.06 |
| 2003/0039143 A1 | 2/2003 | Ogane | |

* cited by examiner

*Primary Examiner* — Son Dinh

(57) ABSTRACT

An address decoder that includes a plurality of predecoders configured to (i) receive and logically combine a clock signal and address signals and (ii) generate addresses and complementary addresses. At least one of the plurality of precoders includes a first logic gate configured to receive the clock signal and one of the address signals, and a second logic gate configured to receive the clock signal and an output of the first logic gate. The address decoder further includes a decoder configured to generate a decoder output based on the addresses and complementary addresses.

18 Claims, 18 Drawing Sheets

| Address Inputs | A(2) | A'(2) | A(1) | A'(1) | A(0) | A'(0) | Decoder Outputs |
|---|---|---|---|---|---|---|---|
| 000 |  | X |  | X |  | X | 0 |
| 001 |  | X |  | X | X |  | 1 |
| 010 |  | X | X |  |  | X | 2 |
| 011 |  | X | X |  | X |  | 3 |
| 100 | X |  |  | X |  | X | 4 |
| 101 | X |  |  | X | X |  | 5 |
| 110 | X |  | X |  |  | X | 6 |
| 111 | X |  | X |  | X |  | 7 |

FIG. 11

ADDRESS DECODER

CROSS-REFERENCE TO RELATED APPLICATIONS

This application is a continuation of U.S. patent application Ser. No. 11/873,505 filed on Oct. 17, 2007, which claims the benefit of U.S. Provisional Application No. 60/829,776, filed on Oct. 17, 2006. The disclosure of the above application is incorporated herein by reference in its entirety.

FIELD

The present disclosure relates to memory systems and more particularly to address decoders for memory systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a memory system 10 includes memory 12 that may include an array of memory cells 14-1, 14-2, ..., and 14-$x$ (collectively referred to as cells 14). The memory cells 14 may be located at intersections of rows/wordlines 16-1, 16-2, ..., and 16-$n$ (collectively referred to as rows 16) and columns/bitlines 18-1, 18-2, ..., and 18-$m$ (collectively referred to as columns 18). Each cell may store one or more bits of data as logical 1's or a logical 0's and may be individually addressed. A logical 1 may be represented by a supply voltage potential Vdd, and a logical 0 may be represented by a reference voltage potential Vss, such as ground.

A memory control module 20 may apply row and column addresses 26, 27, referred to as address inputs, to row and column address decoders 22, 24. The address decoders 22, 24 may use multi-bit numbers to access a row and column respectively in which a particular memory cell is located.

The address decoders 22, 24 may include programmable logic arrays that select outputs 28, 29 of the address decoders 22, 24 that correspond to the respective rows and columns. All but one of the outputs of each address decoder 22, 24 may be set to 0. Therefore when one of the respective address inputs changes, two outputs also change. The logic arrays may include one or more successive stages of logic gates.

The logic gates may be inverters, AND gates, NAND gates, OR gates, NOR gates, etc. and may include combinations of, for example, complementary metal oxide semiconductor (CMOS) circuits. CMOS circuits may include n- and p-channel transistors (referred to as n- and p-type transistors) that include source, drain, and gate terminals, also referred to as first, second, and control terminals, respectively. Other types of transistors may also be used.

The n- and p-type transistors may act as switches that are either open or closed. Sources and drains of n- and p-type transistors communicate when the devices are closed and do not communicate when the devices are open. An n-type transistor is open when the gate is at a logical 0, and closed when the gate is at a logical 1. A p-type transistor is closed when the gate is at a logical 0, and open when the gate is at a logical 1.

As the number of memory bits increases, the number of successive stages of logic gates may also increase. Each additional stage adds decoding delay.

The first/input stage of an exemplary address decoder 22 may include inverters such that subsequent stages receive address inputs A and complement address inputs A' of the address information. In other words, when A=0, A'=1 and vice versa. The address and complement address inputs may also referred to as non-inverted and inverted address inputs respectively. For N address inputs, the address decoder may have $2^N$ outputs, so there will be one line at the output for each possible input. The first stage may also be referred to as a predecoder stage and may logically combine address inputs using, for example, one or more AND logic gates.

Address decoders may be static or dynamic and may include static or dynamic CMOS circuits respectively. Outputs of static decoders are logical functions of the inputs. In contrast, a control signal, such as a clock signal, may control outputs of dynamic decoders so that the outputs are not necessarily functions of the inputs.

Referring now to FIG. 2, an exemplary static decoder 22 includes five logic stages 30-34 to identify one of $2^N$ rows or columns based on N address inputs. Where N=9, address inputs A0, A1, ..., and A8 may be used to identify one of $2^9$ or 512 rows or columns. The first stage 30 may include inverters 36 that invert address inputs A0, A 1, and A8 to generate inverted inputs A'0, A'1, ..., and A'8. The second stage 31 may include NAND gates 40 that receive combinations of the inverted and non-inverted address inputs. The third and fourth stages 32, 33 may include NOR gates 42 and AND gates 44 respectively that may receive and logically combine outputs of preceding stages. The fifth stage 34 may include inverters 46 that invert outputs of the AND gates 44. Outputs of the fifth stage 34 correspond to decoder outputs.

Referring now to FIG. 3, an exemplary dynamic decoder 22 may include fewer elements than an equivalent static decoder but may switch between decoder outputs based on clock signals 48. A dynamic decoder 22 may include sequential stages of logic gates, such as an input stage 52, a dynamic stage 54, a combination stage 56 and an output stage 58. Similar to static decoder logic, the input stage 52 may include inverters 60, so that subsequent stages receive inverted and non-inverted address inputs A'(0), A(0), etc. The dynamic stage 54 may be controlled by the clock signal 48 and may include sub-stages that also include sequential logic gates. The combination stage 56 may include NAND gates 62 that combine multiple dynamic stage outputs. The output stage 58 may include inverters 64 to generate decoder outputs.

Referring now to FIG. 4, the dynamic decoder of FIG. 3 is a NAND decoder where the dynamic stage 54 includes dynamic NAND sub-stages. Instead of a dynamic NOR sub-stages, the dynamic stage 54 is a NAND to produce the one-hot logic. In FIG. 4, a dynamic NAND stage 54 may receive address inputs, for example, address inputs A(0), A(1) and a clock signal 48. The dynamic NAND stage 54 may include p- and n-type transistors 104, 106 and 108, 110, 112 respectively, and multiple inverters 114, 116, 118.

When the clock signal 48 is low, a setup/precharge phase occurs. In the precharge phase, the output 120 is driven low regardless of address inputs. Also in this phase, p-type transistor 104 may charge so that the output 120 may be at low/connected to Vss. When the clock signal 48 is high, a second phase, which may be referred to as an evaluation phase, occurs. During the evaluation phase, if inputs A(0), A(1) are also high, the output 120 may be pulled high. In other words, if all received inputs A(0), A(1) are high, then sources and drains n-type transistors 108, 110 will conduct, and sources and drains of the p-type transistors 104, 106 will not conduct. Thus a path may be established between the output 120 and Vdd that may pull the output 120 high. Otherwise, the output 120 may remain low due to the feedback loop formed by the p-type transistor 106.

Referring now to FIGS. 5 and 6, an exemplary dynamic NOR decoder 54 receives address inputs (for example, address inputs A(0)-A(3)), each received in a respective n-type transistors 134-137, and a clock signal 48. The n-type transistors 134-137 are connected in parallel between a dynamic/first node 142 and a second node 143 that communicates with Vss.

When the clock signal 48 goes high, it charges a capacitor formed by n-type transistor 150. P-type transistor 155 is turned on, and p-type transistor 152 cuts off the path to the ground node 143 through n-type transistor 133 while inverter 154 pulls node 144 low. In the meantime, node 142 resets to Vss. When a clock signal 48 goes low, n-type transistor 150 dumps the charge it receives when clock signal 48 is high. The charge goes through n-type transistor 152 and is distributed across node 142 and 145. If A(0), A(1), A(2), and A(3) are all receiving low signals, the charge from n-type transistor 150 raises the voltage of node 142 to a point that inverter 161 may flip/pull up node 146, and, in turn, turn on p-type transistor 160. As a result, node 142 may rise to Vdd. This transition propagates from node 142 to node 158, and, thus, a word line is asserted.

In FIG. 6, the voltage of the dynamic node 142 may correspond to the charging voltage of the n-type transistor 150. A waveform 162 illustrates voltage of the dynamic node 142 when the n-type transistor 150 is sufficiently large to charge up the voltage of node 142 to flip inverter 161. The decoder output 158 may represent one of the decoder outputs (for example, decoder output 0). The decoder output 158 may be pulled high when the node 142 follows waveform 162. During evaluation, when the clock signal 48 goes low, and any of the inputs A(0)-A(3) are high, the waveform of Net 142 follows waveform 164, and the output 158 may be pulled low. Otherwise, if all the inputs A(0)-A(3) are low, the waveform of Net 142 follows waveform 162, and the output 158 may be pulled high.

A dotted waveform 163 illustrates an insufficient charge on node 142 that fails to flip inverter 161. The insufficient charge is due to a respective insufficient charge storage capacity of n-type transistor 150. Therefore, a relatively large device area may be required for n-type transistor 150 to produce sufficient charge, and to assure the functionality for the dynamic NOR decoder 54 of FIG. 5. As the width of the decoder increases to 4-bit or more, the total parasitic capacitance on node 142 increases, and a bigger charge storage transistor 150 is also required to match the charge-sharing from node 142. The size of this transistor 150 may become impractical to implement when the width is greater than 4.

Furthermore, as the decoder width increases, the parasitic capacitance on node 142 increases due to longer interconnect and more diffusion capacitance from individual n-type transistors (for example transistors 134-137). Larger device sizes for n-type transistors 134-137 may be needed so that the charge dumped on node 142 may be drained fast enough without reaching a peak value 165. The peak value 165 may be higher than the trip point of the inverter 161 and may result in a false evaluation. However, increasing the device sizes of n-type transistors 134-137 in turn increases the parasitic capacitance on node 142. This tuning process results in a loop that may be difficult to converge.

Referring to FIG. 7, another dynamic NOR decoder 54 includes sources and drains of n-type transistors 202-204 connected in parallel between nodes 206 and 207 respectively. The gates of the transistors 202-204 receive address input signals, for example A(0)-A(3). The decoder 54 also includes p-type transistors 210, 212 that control clocking operations, an n-type transistor 214 that controls evaluate operations, and an n-type transistor 218 that controls screening operations. The gates of the clocking transistors 210, 212 and evaluation transistor 214 receive the clock signal (CLK) at node 48.

Nodes 206, 208 charge to Vdd when the clock signal 48 is low. When the clock signal 48 switches high, voltage present on either node 206 or node 208 is discharged to Vss through the evaluation transistor 214, depending on the logic appearing at the gates of N-type transistor 202-204. If all of the gates of n-type transistors 202-204 receive Vss at their gates, the voltage on node 206 remains at Vdd. The voltage on node 208 drops to Vss as the gates of the screening n-type transistor 218 and the evaluation transistor 214 receive logic high signals at node 206 and node 48. The logic high signals allow transistors 214, 218 to conduct. As a result, a pull-up p-type transistor 240 turns on, connects Vdd and node 206, and holds node 206 at logic high. This operation results in a transition of low to high at output node 233 while output node 234 remains at logic low. On the other hand, if one of the signals of A[0], A[1] or A[2] is high, node 206 discharges and shuts screening n-type transistor 218 while turning on the pull-up p-type transistor 242. As a result, output node 234 switches from logic low to high, and output node 233 remains at logic low. In summary, inverters 230, 232 output complementary signals when CLK rises.

The decoder 54 of FIG. 7 requires a significant setup time for the address input signals to be stable against the rise of CLK, which adds to the cycle-time overhead. The evaluation transistor 214 also doubles the stack height of the N-tree formed by N-type transistor 202-204, and reduces the efficiency of the operation. As a result, the width of the decoder is limited to 3 or 4-bits, and multiple stages of the decoder 54 may be needed for wider decoding. Accordingly, multiple CLK signals with carefully constructed delay tracking elements are required. Also, repeated setup time may be required across the chain of the decoder 54.

Referring to FIG. 8, still another dynamic decoder 250 is illustrated as an example of the implementation using the dynamic AND of FIG. 4. The input width is limited to 3. Therefore, three stages may be required for a 9-to-512 decoding. The decoder 250 includes cascaded/connected in series stages 252, 254, 260 of dynamic AND of FIG. 4. The clock signal 48 synchronizes the first stage 252 so all gates within the stage are evaluated simultaneously. Each subsequent stage 254, 260 receives and logically combines signals from a previous stage to generate decoder outputs, and therefore the decoder 250 may be referred to as a domino decoder.

SUMMARY

In general, in one aspect, this specification describes an address decoder that includes a plurality of predecoders configured to (i) receive and logically combine a clock signal and address signals and (ii) generate addresses and complementary addresses. At least one of the plurality of precoders includes a first logic gate configured to receive the clock signal and one of the address signals, and a second logic gate configured to receive the clock signal and an output of the first logic gate. The address decoder further includes a decoder configured to generate a decoder output based on the addresses and complementary addresses.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 11 is a table that illustrates exemplary address decoder outputs;

DETAILED DESCRIPTION

Figure 1:
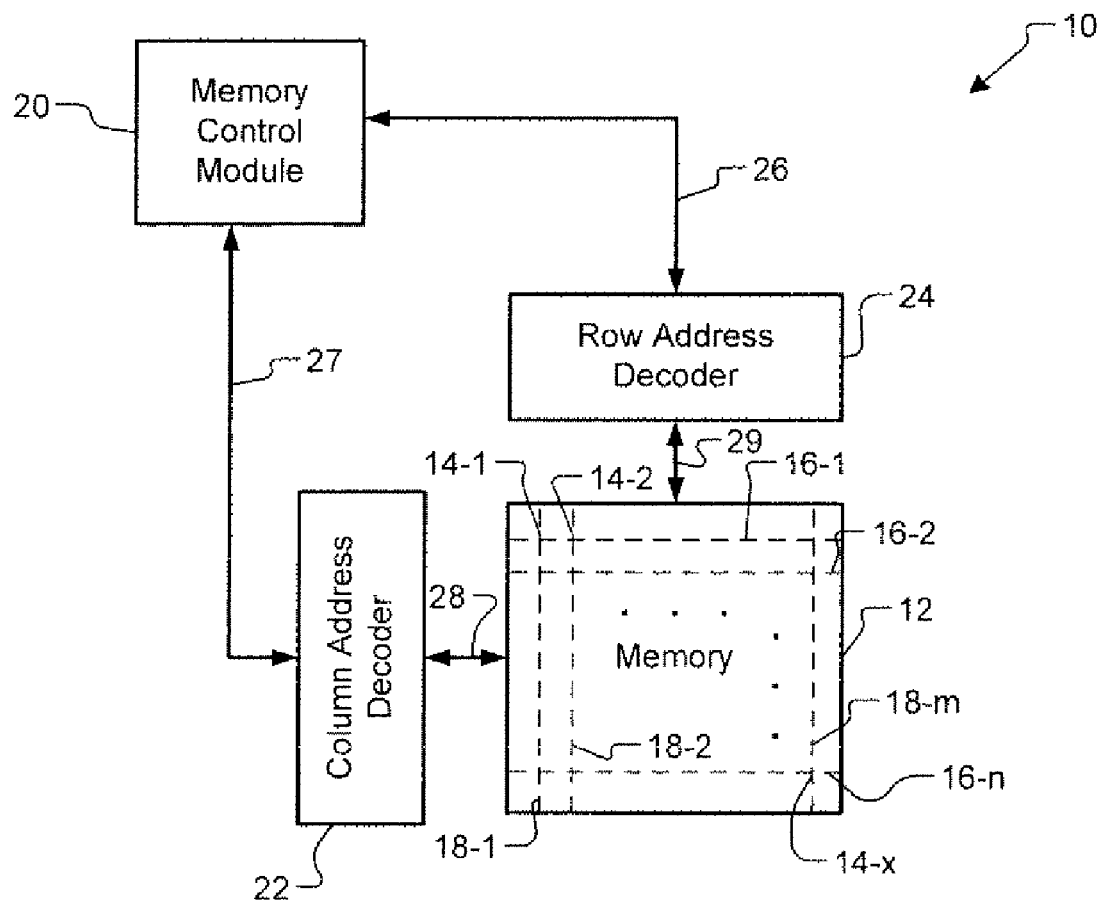
FIG. 1 is a schematic diagram of a memory system according to the prior art.
Figure 2:
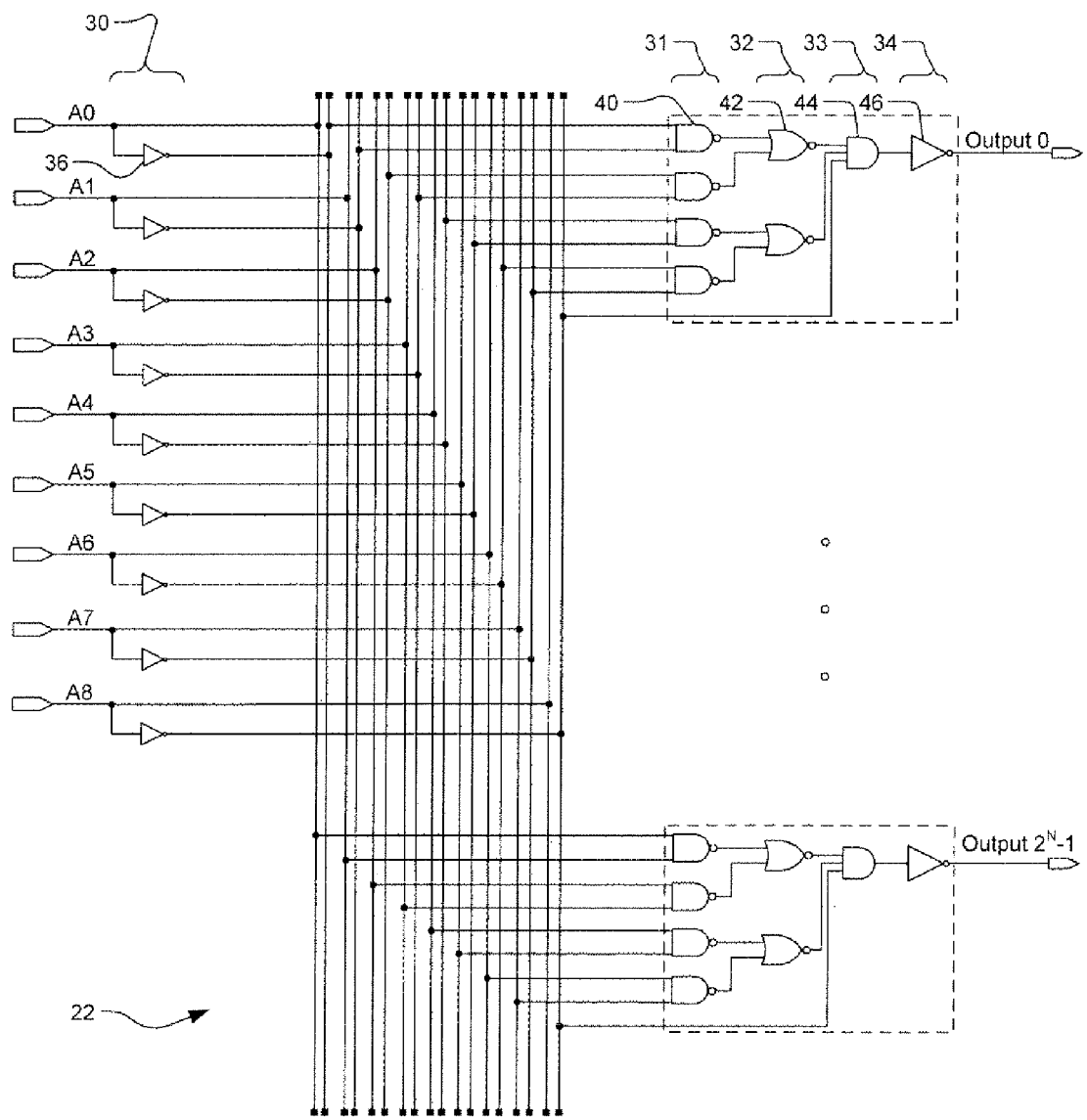
FIG. 2 is a schematic diagram of a static address decoder according to the prior art.
Figure 3:
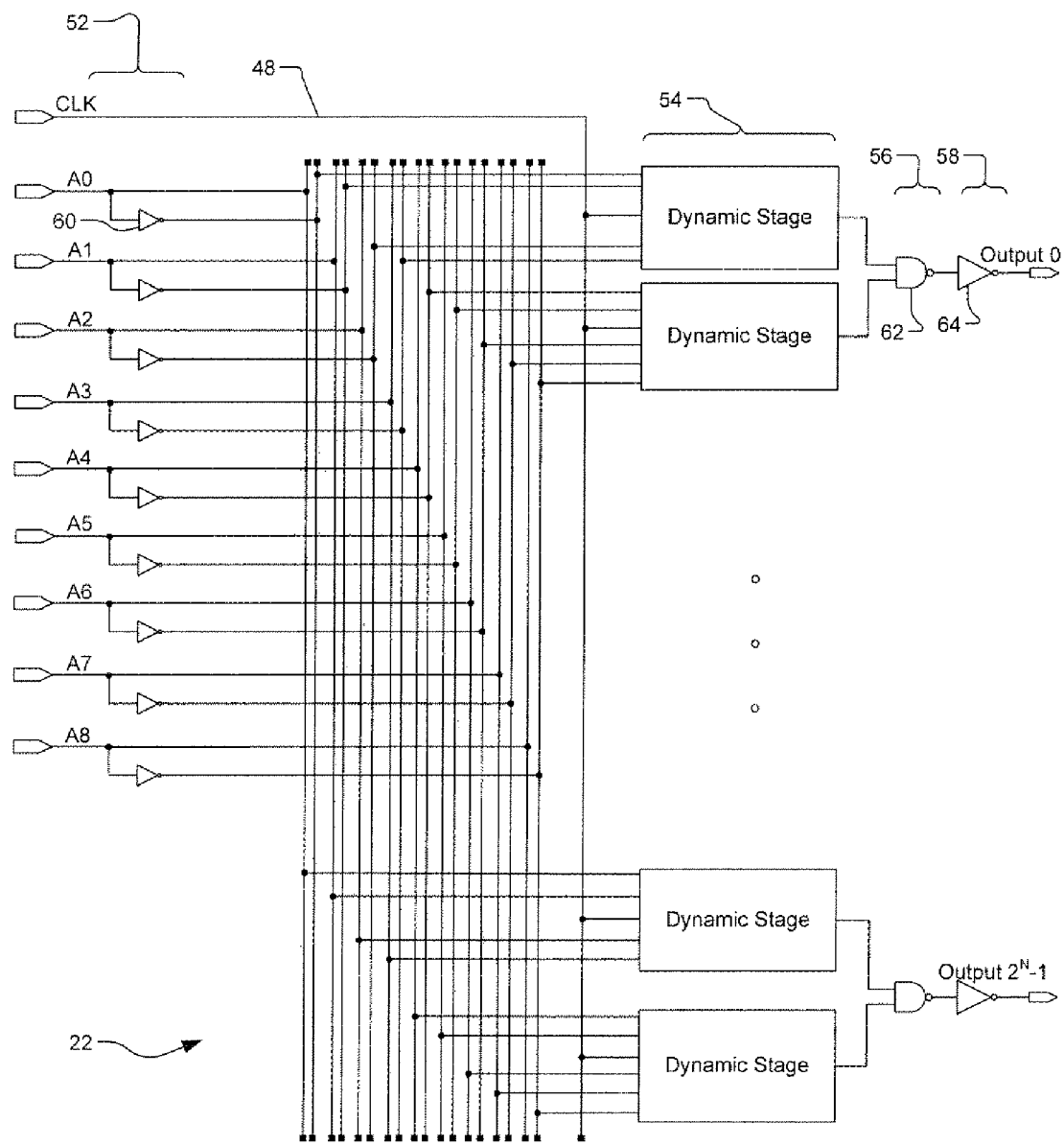
FIG. 3 is a schematic diagram of a dynamic address decoder according to the prior art.
Figure 4:
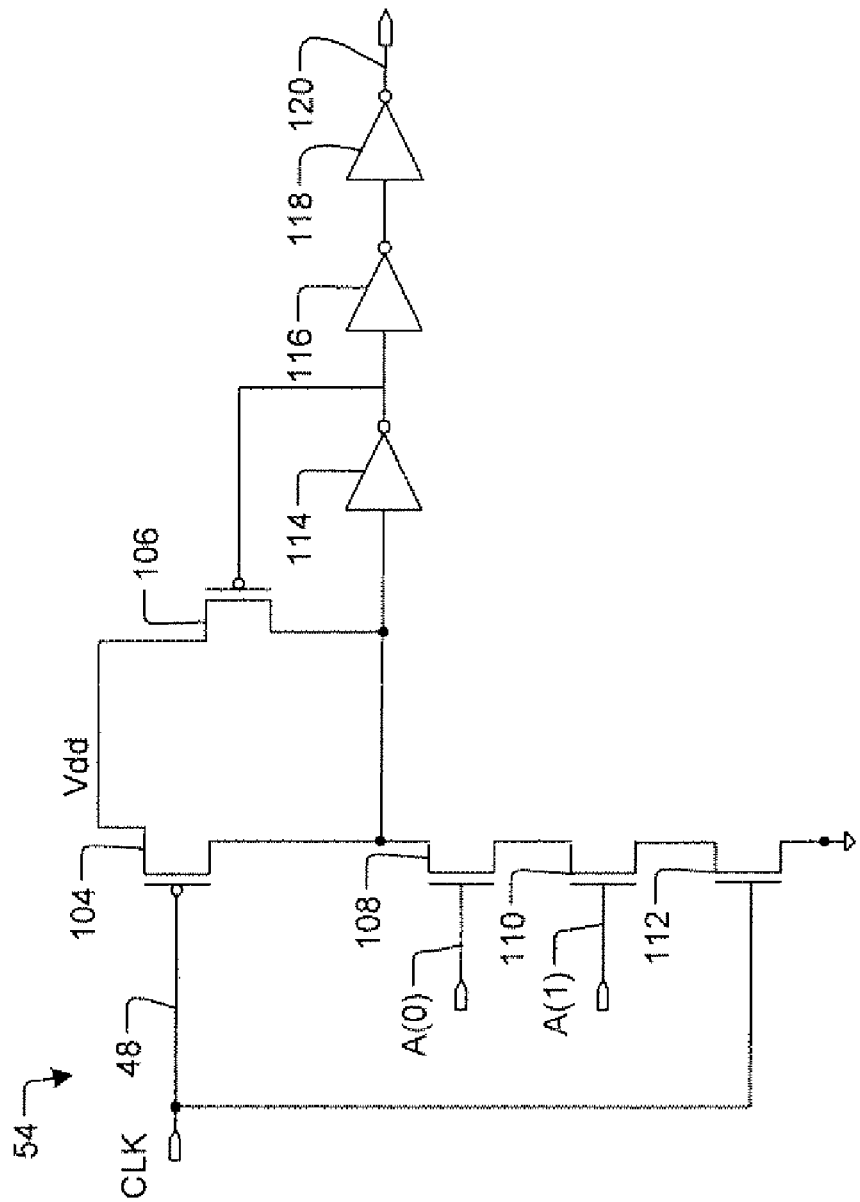
FIG. 4 is a schematic diagram of a dynamic AND address decoder circuit according to the prior art.
Figure 5:
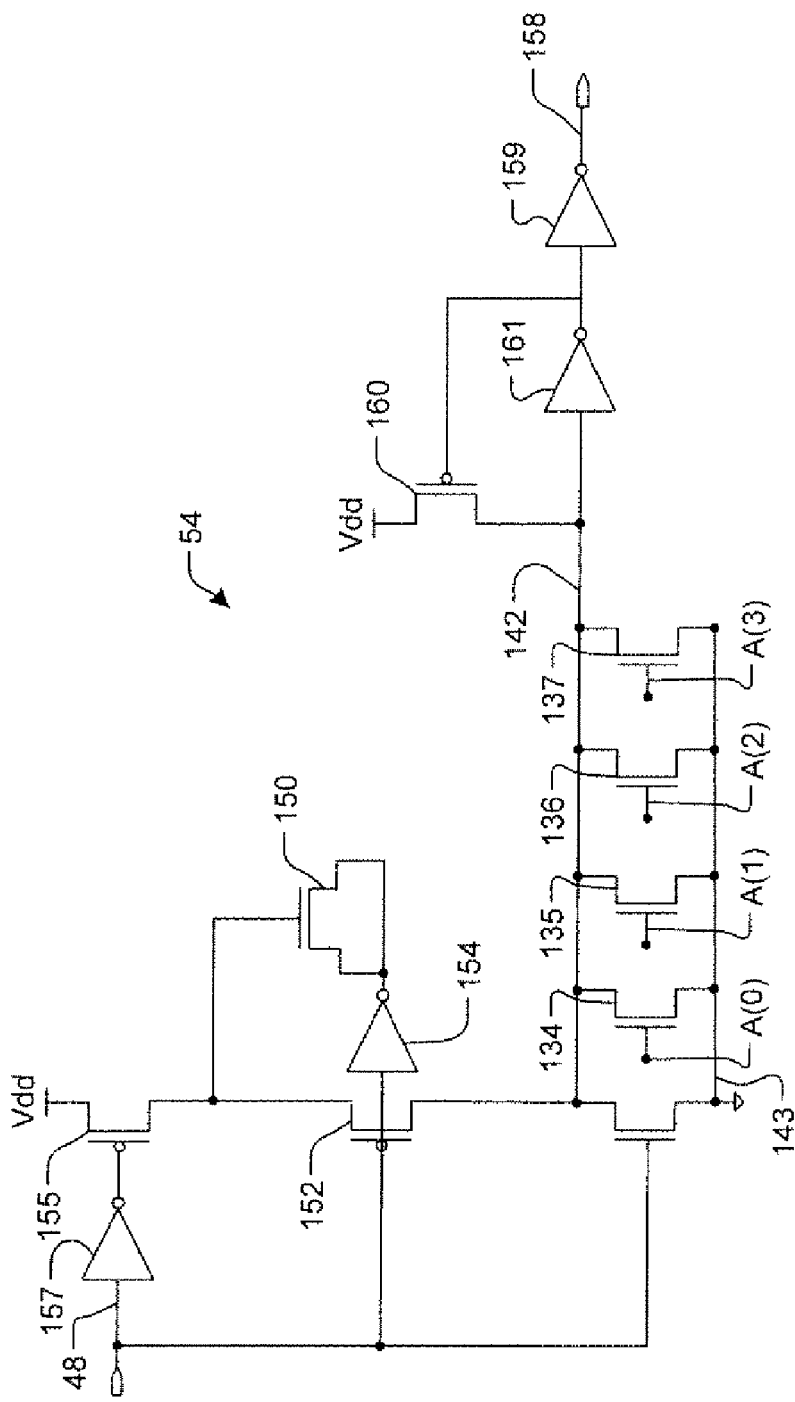
FIG. 5 is a schematic diagram of a dynamic OR address decoder circuit according to the prior art.
Figure 6:
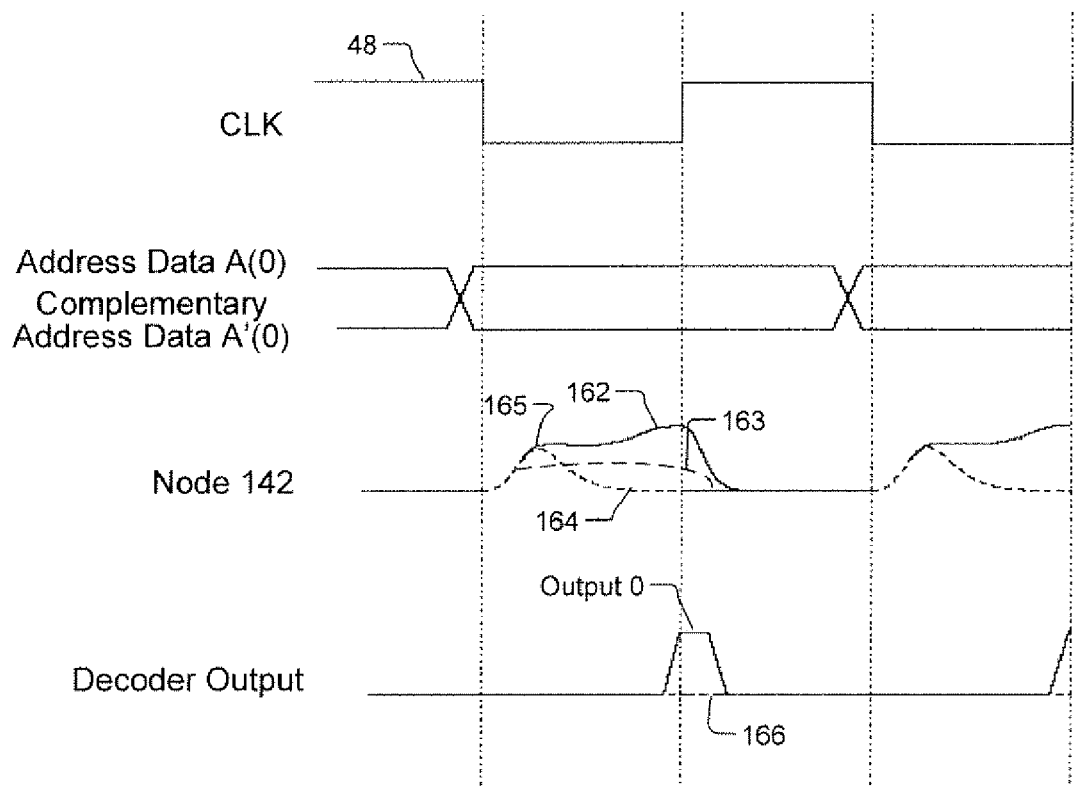
FIG. 6 is a waveform diagram for a dynamic OR address decoder circuit of FIG. 5.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 9:
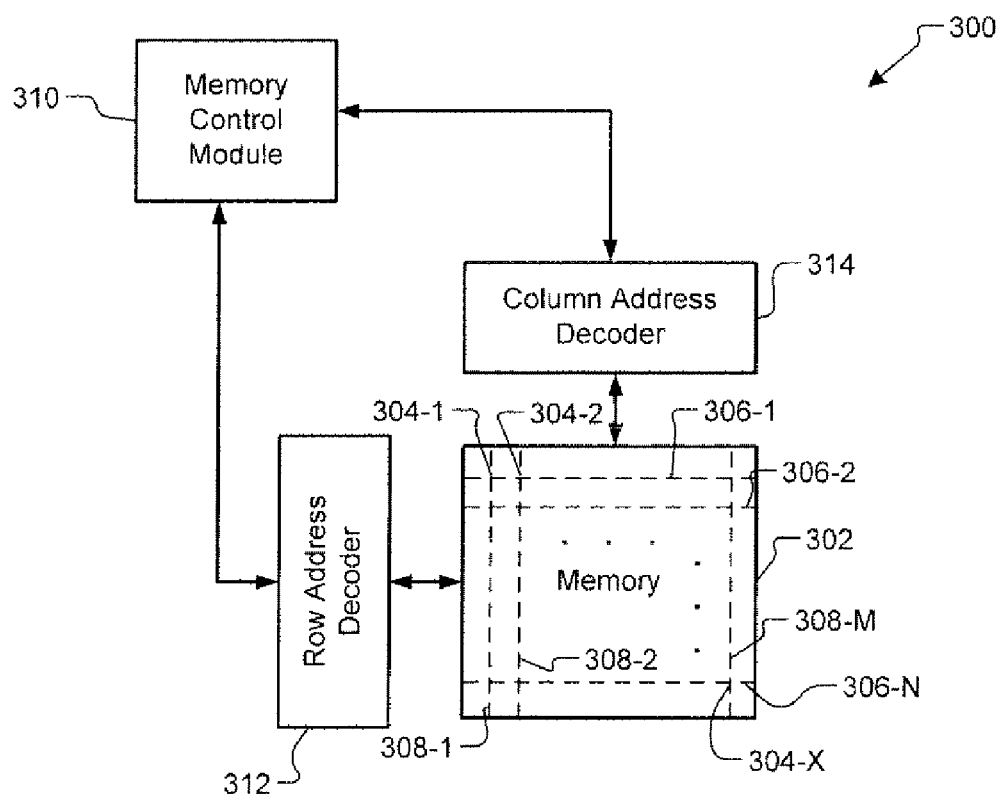
FIG. 9 is a schematic diagram of a memory system according to the present disclosure.

Referring now to FIG. 9, a memory system 300 includes memory 302 that may include an array of memory cells 304-1, 304-2, . . . , and 304-X (collectively referred to as memory cells 304). The memory cells 304 may be located at intersections of rows/wordlines 306-1, 306-2, . . . , and 306-N (collectively referred to as rows 306) and bitlines/columns 308-1, 308-2, . . . , and 308-M (collectively referred to as columns 308). A memory control module 310 may apply address information to address decoders 312, 314 to access the memory cells.

Figure 10:
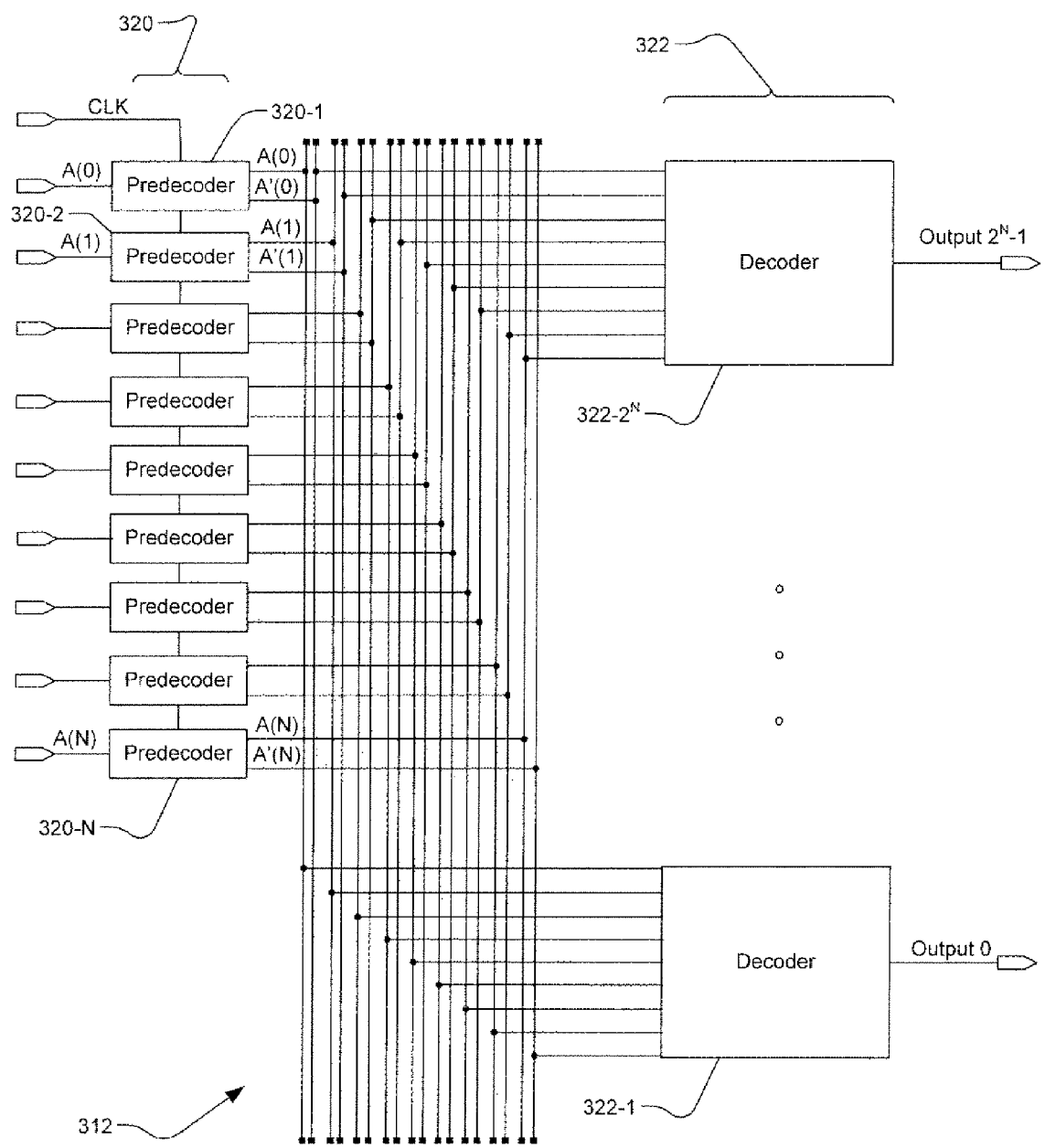
FIG. 10 is a schematic diagram of an address decoder according to the present disclosure.

Referring now to FIG. 10, an exemplary address decoder 312 may include sequential stages. The stages may include a predecoder stage 320, which may be referred to as an input stage, and a modified decoder stage 322, which may be referred to as a data clocked-stage. The stages 320, 322 may include arrangements of logic gates.

The logic gates may be inverters, AND gates, NAND gates, OR gates, NOR gates, etc. and may include combinations of, for example, complementary metal oxide semiconductor (CMOS) circuits. CMOS circuits may include n- and p-channel transistors (referred to as n- and p-type transistors) that include source, drain, and gate terminals, also referred to as first, second, and control terminals respectively.

The predecoder stage 320 includes a plurality of predecoders 320-1, 320-2, . . . , 320-N that receive address signals A(0), A(1), . . . , and A(N) respectively from the memory control module 310. The predecoder stage 320 derives address data/inputs and complementary address data/inputs, for example A(0), A'(0), from the address signal A(0).

The modified decoder stage 322 includes a plurality of decoders 322-1, 322-2, . . . , 322-$2^N$. For example, for N address inputs, there may be $2^N$ decoders providing $2^N$ possible address decoder outputs, which are illustrated as outputs 0 to $2^N-1$. Various other address input to address decoder output ratios are also contemplated within the scope of the present disclosure.

Referring now to FIG. 11, an exemplary table illustrates decoding for a 3-bit address input (i.e. N=3) for address decoder outputs 0-7. For example, when the address inputs are A(0)=0, A(1)=0, and A(2)=0, address decoder output 0 is pulled high, and address decoder outputs 1-7 are pulled to a logical 0. A(2) may be considered the most significant bit (MSB) or left-most bit of the address inputs, and A(0) may be considered the least significant bit (LSB) or right-most bit of the address inputs.

Figure 12:
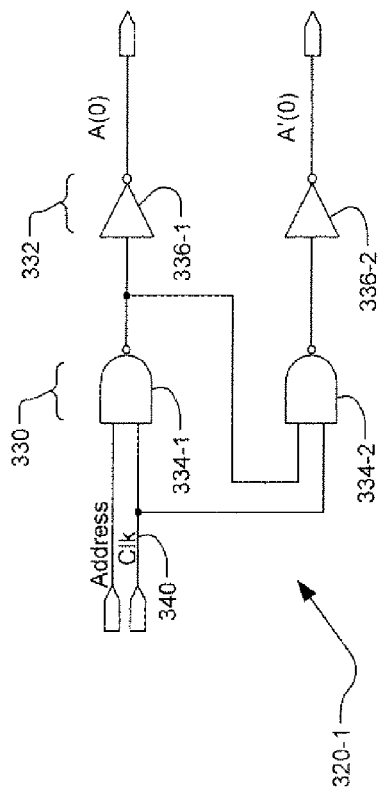
FIG. 12 is a schematic diagram of an predecoder circuit for an address decoder according to the present disclosure.

Referring now to FIG. 12, the predecoder stage 320 may predecode address signals to provide address and complementary address inputs A(0), A'(0), A(1), A'(1), etc. An exemplary predecoder 320-1 may include sub-stages 330, 332 that include NAND gates 334-1, 334-2 and inverters 336-1, 336-2 respectively. Both NAND gates 334-1, 334-2 received the clock signal 340, but only the NAND gate 334-1 receives the address input. A source of the NAND gate 334-2 is coupled to the output of the NAND gate 334-1. The NAND gates 334-1, 324-2 act as a flip-flop/latch, which has two stable states, that may retain one bit of data. The inverters 336-1, 336-2 receive outputs of the NAND gates 334-1, 334-2 respectively to derive the addresses and complementary addresses.

Various other predecoder stages are also contemplated within the scope of the present disclosure. For example, some modifications may be made on predecoder stage 320 to create an edge-triggered flip-flop with monotonic outputs A(0) and A'(1), which requires a minimum hold time of the address inputs.

In operation, both the outputs (for example, A(0) and A'(0)) may be reset when the clock signal 340 is low. When the clock signal 340 goes high, A(0) becomes a logical 1 and A'(0) remains a logical 0 if the address input is a logical 1. Similarly, if the address input is a logical 0, A(0) remains a logical 0; and A'(0) becomes a logical 1 when the clock signal goes high. In other words, the predecoder stage 320 periodically generates the address and complementary address outputs simultaneously.

Both of the outputs of inverters 336-1, 336-2 become logical 0's when the external clock signal 340 goes low. Previously, the complementary address inputs would have been delayed because they would have to be inverted while the address inputs would have been received directly in subsequent decoder stages.

The predecoded address signals A(0), A'(0), etc. therefore toggle in a manner similar to a clock and serve as synchronizing clock sources for the decoder stage 322. The predecoder stage 320 may therefore also be referred to as a data based clock. The address decoder stage 322 may therefore receive all address and complement address inputs in a single burst/strobe.

Figure 13:
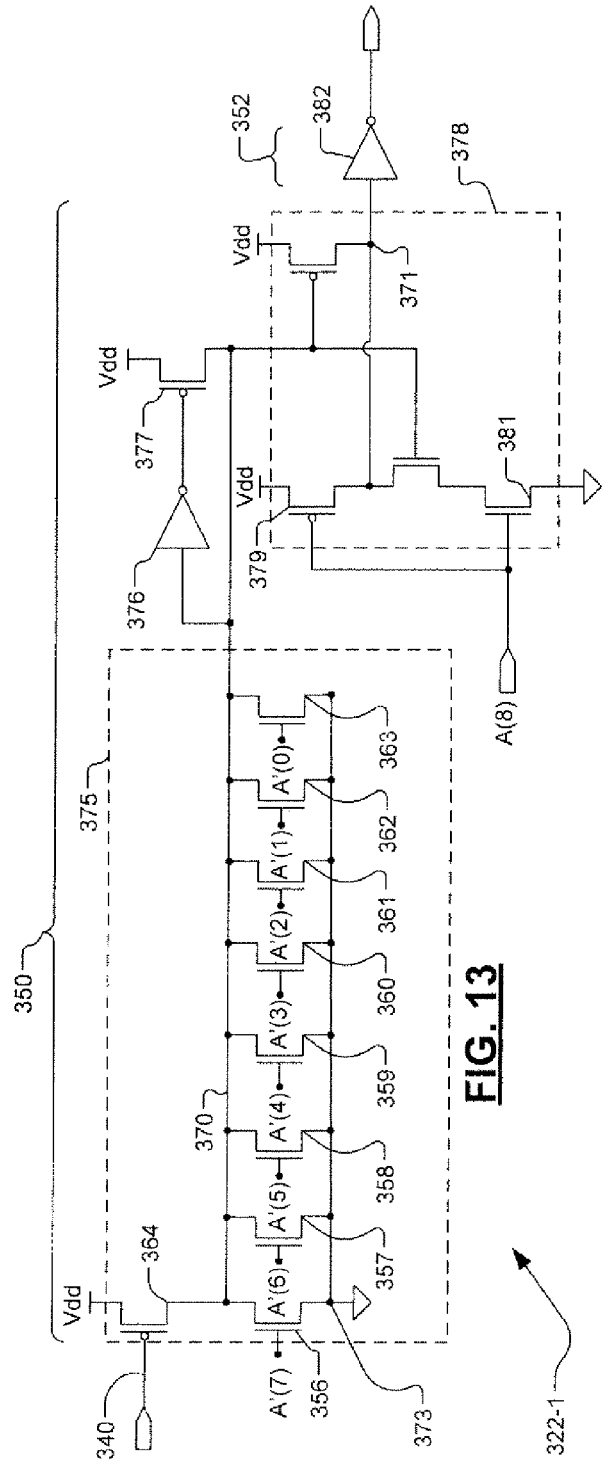
FIG. 13 is a schematic diagram of a decoder circuit for an address decoder according to the present disclosure.

Referring now to FIG. 13, the decoder stage 322 may include a plurality of decoders that receive the address inputs and the complementary address inputs A(0), A'(0), etc. The decoders may be referred to as a data clocked decoders that include data-clocked domino (DCD) circuits. The DCD circuits may include OR/AND/Inverter (OAI) logic that may be cascaded such that the output of the AND logic may not change states until the output of the OR logic changes states. Further, the output of the inverter logic may not change states until the output of the AND logic changes states.

An exemplary decoder 322-1 may include sub-stages 350, 352. The sub-stage 350 may include both OR and AND logic, for example, a NOR gate 375 and NAND gate 378. The NAND and NOR gates 378, 375 may be cascaded such that the address input of NAND gate 378, A(8), for example, rises and strobes NAND gate 378. Meanwhile, the rest of the address inputs arriving at NOR gate 375 and set the value of node 370. Because of the body effect on n-type transistor 391, address input A(8) may arrive as early as the other address inputs arrive at NOR gate 375 without catching an incorrect state at node 370. In practice, the delays of the address inputs from the outputs of predecoder stage 320-1 to the inputs of decoder stage 322-1 may be matched using the same routing structure.

N-type transistors 356-363 and p-type transistor 364 may function as the NOR gate 375. The transistors 356-363 may receive complementary address inputs in respective control terminals. The transistors 356-363 may also include drains that communicate with a common dynamic/first node 370 and sources that communicate with a second node 373 that communicates with Vss.

The p-type transistor 364 may receive the clock signal 340 in a control terminal and may include a source and drain communicating with Vdd and the dynamic node 370 respectively. The p-type transistor 364 may control precharge/evaluate operations for the sub-stage 350 because, when the clock signal is low, Vdd communicates through the p-type transistor 364 with the dynamic node 370. The decoder stage 322 may therefore precharge the dynamic node 370 when the clock signals 340 is low and evaluate the dynamic node 370 when the clock signal 340 is high.

The dynamic node 370 is charged to Vdd during the precharge phase. If none of the exemplary transistors 356-363 discharge the dynamic node 370 to ground during the evaluation phase, then the dynamic node 370 may be at a high impedance with no direct route to Vdd or ground. For this case, charge leakage may occur off dynamic node 370. To prevent charge leakage, the transistor 377, which may be referred to as a keeper transistor, may maintain the dynamic node 370 at Vdd when the clock signal 340 goes high for evaluation. The address inputs A'(0)-A'(7) result in node 370 remaining at a logic high state. The transistor 377 may communicate through the dynamic node 370 via an inverter 376. Inverter 376 may be replaced with a NAND gate having one input driven by node 370 and another input driven by delayed and inverted clock signal 340 so that transistor 377 is enabled after node 370 is discharged through transistors 356-363. Thus, conflict between transistor 370 and transistors 356-363 during the discharge may be avoided.

The NAND gate 378 may also communicate with the dynamic node 370. The NAND gate may receive address inputs in p- and n-type transistors 379, 381 respectively. In an exemplary embodiment, both transistors 379, 381 receive a common address input. An output node 371 may be controlled by outputs from the NAND gate 378. The sub-stage 352 may include an inverter 382 that buffers/inverts output node voltages to generate address decoder outputs.

Figure 7:
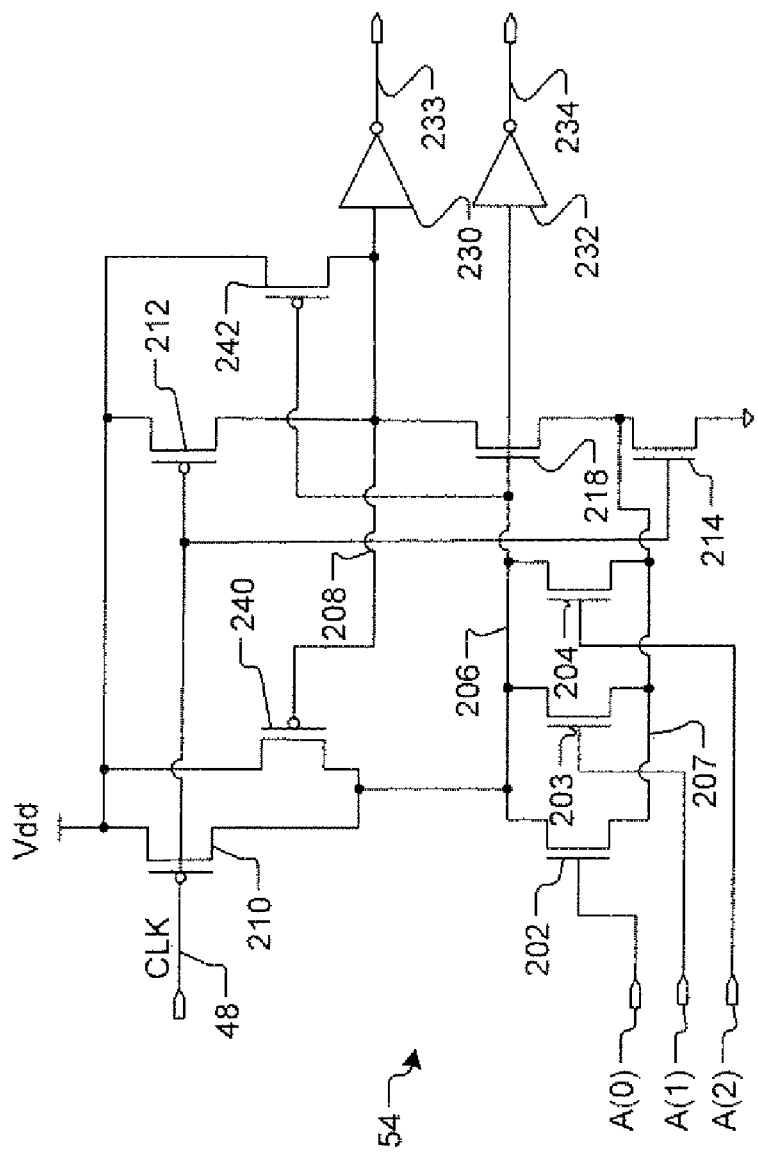
FIG. 7 is a schematic diagram of a dual-rail OR address decoder circuit according to the prior art.
Figure 8:
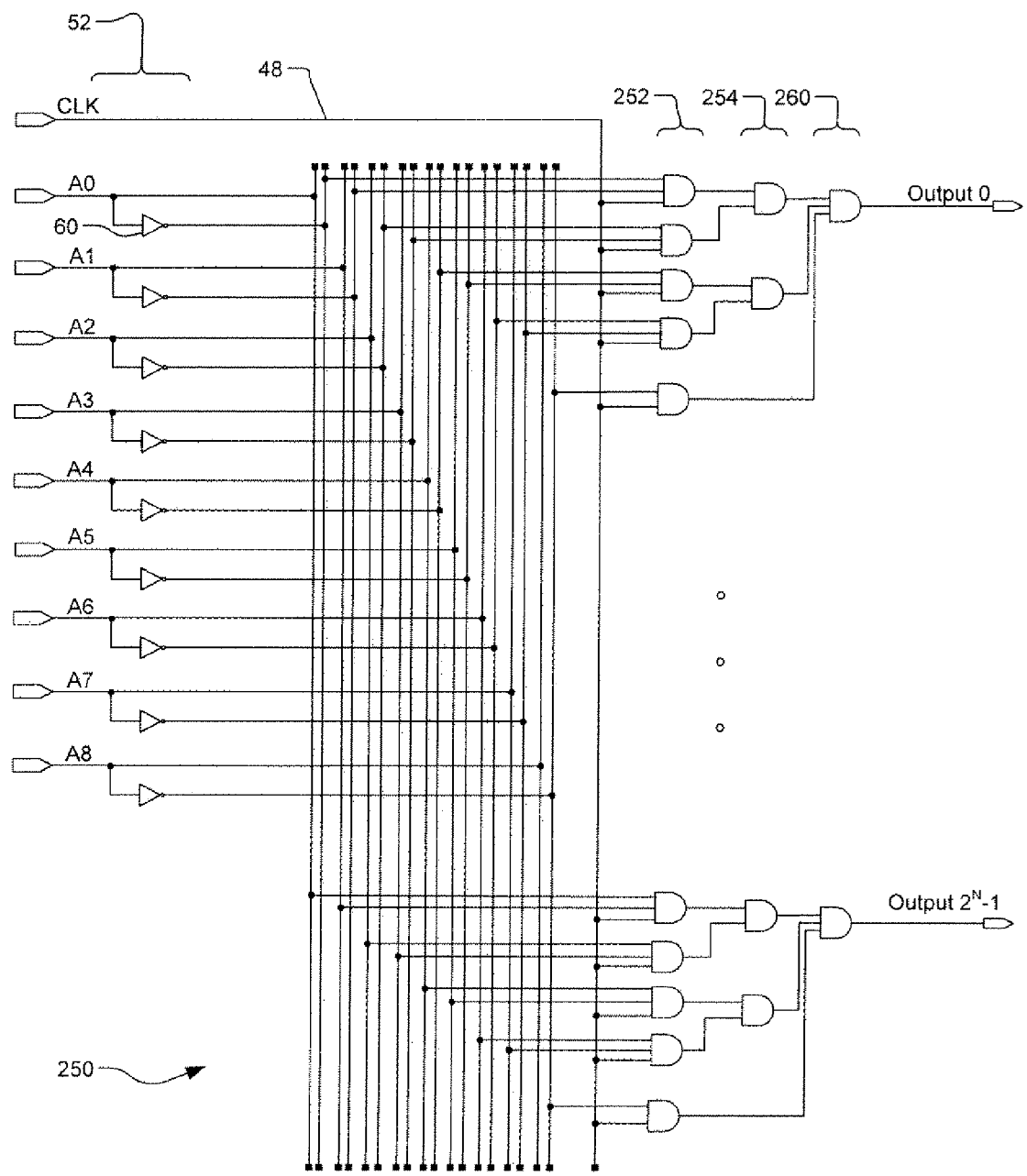
FIG. 8 is a schematic diagram of an address decoder according to the prior art.

The NAND gate 378 may receive either an address input or a complementary address input, and the NOR gate 375 may receive a combination of the address inputs and the complementary address inputs. Further, the NAND gate 378 may receive an address input, and the NOR gate 375 may not receive a corresponding complementary address input. The NAND gate 378 may receive inputs no earlier than the NOR gate 375. Both the NAND and NOR gates 378, 375 may receive inputs sequentially and/or simultaneously because the data is "clocked" and is therefore periodically output from the predecoders. Previously, complex clocking circuitry that received a clock signal and generated many other delayed clock signals would have had to be included to coordinate reception of address inputs in NOR gates followed by NAND gates, as seen in FIG. 7.

The outputs from the predecoder stage 320, namely A(0)-A(N) and A'(0)-A'(N), may communicate with the inputs of the decoder stages 322 depending on the address being decoded. For example, to decode the most-significant address bit from 9-bit address, the NOR gate 375 receives A'(0)-A'(7), and the NAND gate 378 receives A(8). Further, to decode the least-significant address bit, the NOR gate 375 receives A(0)-A(7), and the NAND gate 378 receives A'(8).

In operation, the NOR gate 375 may precharge the dynamic node 370 when the clock signal 340 is low (precharge state) and evaluate the dynamic node 370 when the clock is high (evaluate state). In the precharge state, the dynamic node 370 is charged to Vdd. In the evaluate state, n-type transistors 356-363 may discharge the dynamic node 370 to Vss if any of the address inputs are high or may allow the charge on the dynamic node 370 to persist if all the address inputs are logical 0's. The final charge on the dynamic node 370 may thereby be controlled by the particular values of the address inputs 356-363.

The NAND gate 378 may precharge the node 371 when the address input is a logical 0. The NAND gate 378 may discharge the node 371 to ground when the address input received in the NAND gate 378 is a logic 1 and the charge on the node 370 are a logical 1. The node 371 may therefore be considered complementary to the node 370.

An alternative implementation of address decoder 322-1 includes connecting node 373 to node 374. When an n-type transistor 381 receives a logic 1 at a respective input, a path to ground is provided, such as having node 373 connected to ground. When the n-type transistor 381 receives a logic 0 at the respective input, the transistor 381 inhibits node 370 from discharging regardless of the address inputs transistors 356-363 receive. Thus, the charge at node 370 may be preserved for half of the address decoder 312 in which the n-type transistor 381 receives a logic 0. Power may therefore be conserved.

Figure 14:
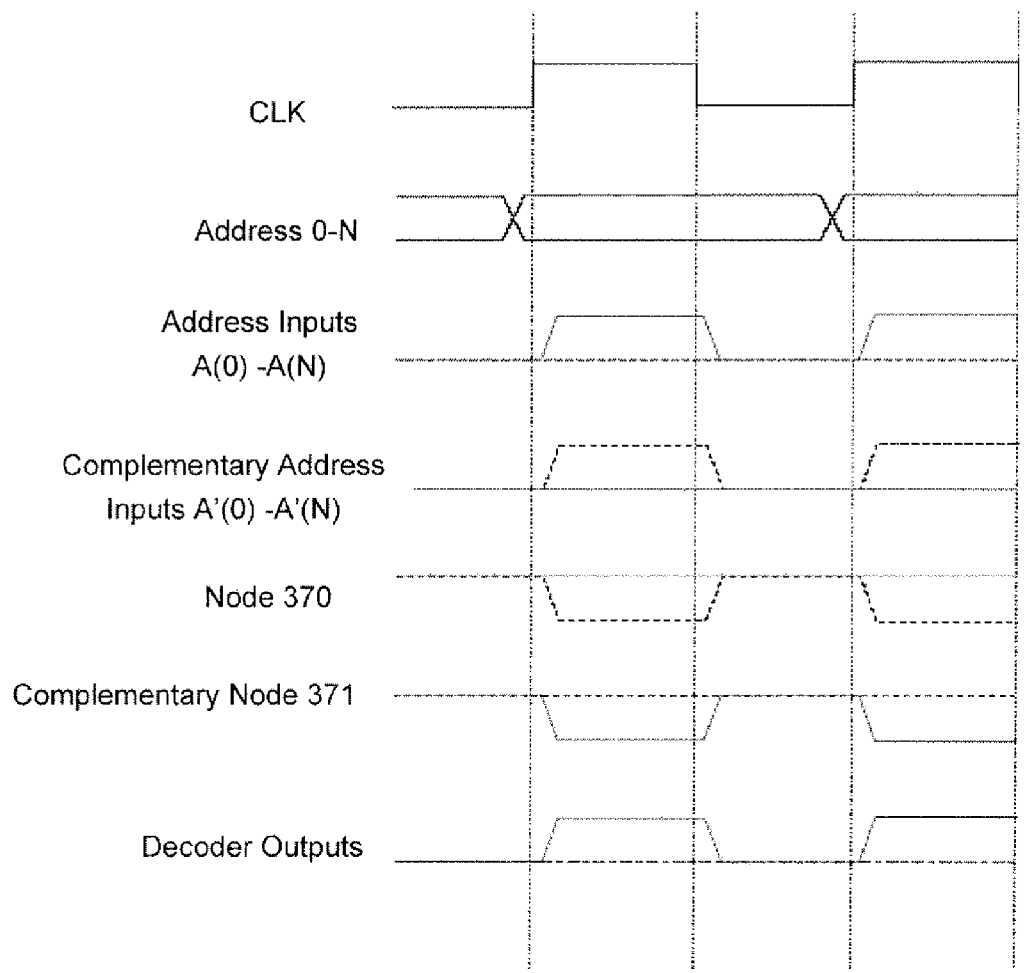
FIG. 14 is a waveform diagram for an address decoder circuit according to the present disclosure.

Referring now to FIG. 14, exemplary waveforms illustrate the timing of the memory control module address signals (Address 0-N), the predecoded address signals (A(0)-A(8) and A'(0)-A'(8)), and the decoder outputs. The charges at nodes 370, 371 are also illustrated. Broken lines are included to illustrate complementary waveform response.

Referring now to FIGS. 15A-15G, various exemplary implementations incorporating the teachings of the present disclosure are shown.

Figure 15A:
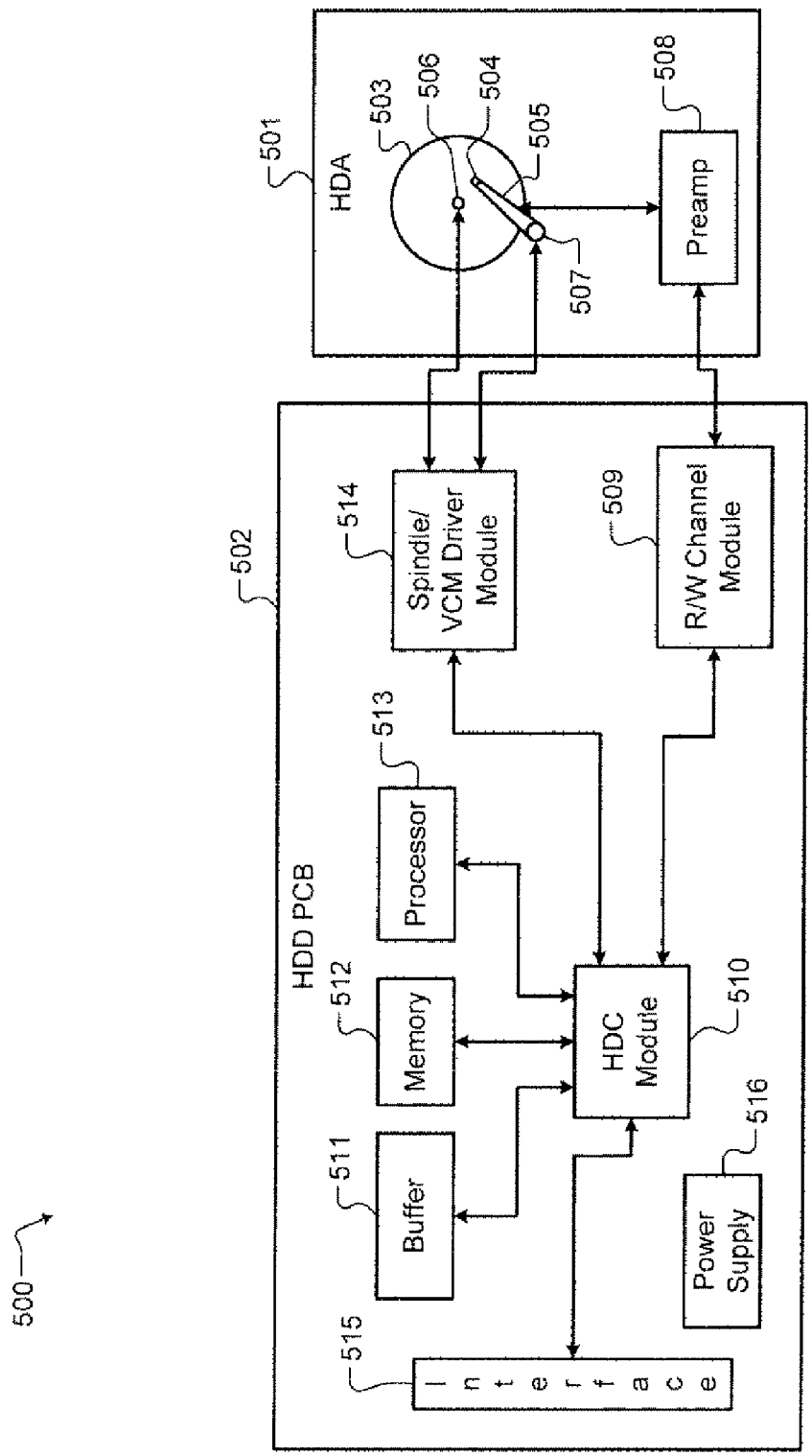
FIG. 15A is a functional block diagram of a hard disk drive.

Referring now to FIG. 15A, the teachings of the disclosure can be implemented in a hard disk controller (HDC) module to communicate with a volatile and/or non-volatile (NV) memory of a hard disk drive (HDD) 500. The teachings of the disclosure may also be implemented in a read/write channel module (hereinafter, "read channel") to communicate with a hard disk assembly (HDA). The HDD 500 includes the HDA 501 and a HDD printed circuit board (PCB) 502. The HDA 501 may include a magnetic medium 503, such as one or more platters that store data, and a read/write device 504. The read/write device 504 may be arranged on an actuator arm 505 and may read and write data on the magnetic medium 503. Additionally, the HDA 501 includes a spindle motor 506 that rotates the magnetic medium 503 and a voice-coil motor (VCM) 507 that actuates the actuator arm 505. A preamplifier device 508 amplifies signals generated by the read/write device 504 during read operations and provides signals to the read/write device 504 during write operations.

The HDD PCB 502 includes the read channel 509, the HDC module 510, a buffer 511, the memory 512, a processor 513, and a spindle/VCM driver module 514. The read channel 509 processes data received from and transmitted to the preamplifier device 508. The HDC module 510 controls components of the HDA 501 and communicates with an external device (not shown) via an I/O interface 515. The external device may include a computer, a multimedia device, a mobile computing device, etc. The I/O interface 515 may include wireline and/or wireless communication links.

The HDC module 510 may receive data from the HDA 501, the read channel 509, the buffer 511, nonvolatile memory 512, the processor 513, the spindle/VCM driver module 514, and/or the I/O interface 515. The processor 513 may process the data, including encoding, decoding, filtering, and/or formatting. The processed data may be output to the HDA 501, the read channel 509, the buffer 511, nonvolatile memory 512, the processor 513, the spindle/VCM driver module 514, and/or the I/O interface 515.

The HDC module 510 may use the buffer 511 and/or nonvolatile memory 512 to store data related to the control and operation of the HDD 500. The buffer 511 may include DRAM, SDRAM, etc. The nonvolatile memory 512 may include flash memory (including NAND and NOR flash memory), phase change memory, magnetic RAM, or multi-state memory, in which each memory cell has more than two states. The spindle/VCM driver module 514 controls the spindle motor 506 and the VCM 507. The HDD PCB 502 includes a power supply 516 that provides power to the components of the HDD 500.

Figure 15B:
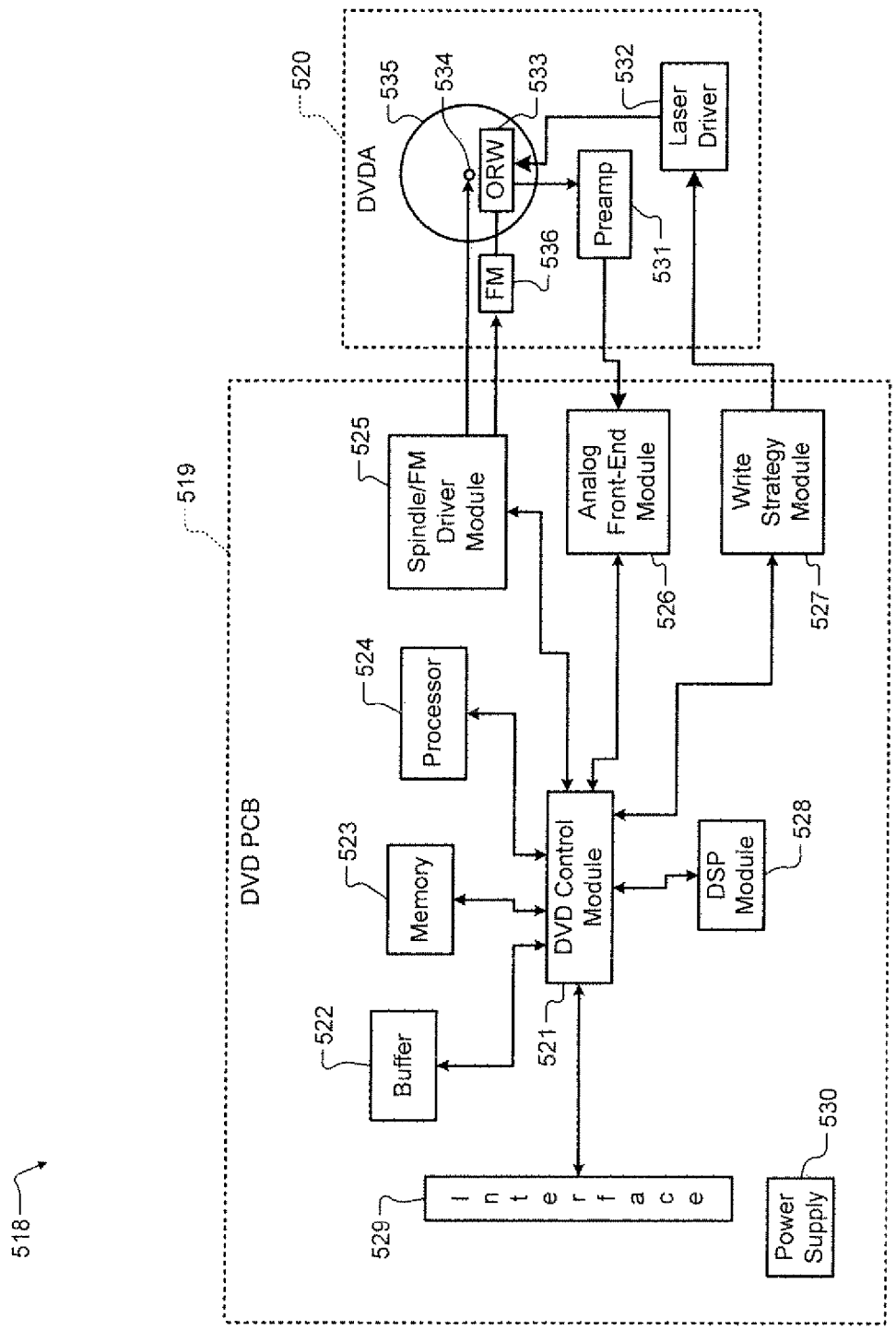
FIG. 15B is a functional block diagram of a DVD drive.

Referring now to FIG. 15B, the teachings of the disclosure can be implemented in a DVD control module to communicate with volatile and/or NV memory of a DVD drive 518 or of a CD drive (not shown). The teachings of the disclosure can also be implemented in a write strategy module to communicate with a DVD assembly (DVDA). The DVD drive 518 includes a DVD PCB 519 and the DVDA 520. The DVD PCB 519 includes the DVD control module 521, a buffer 522, the memory 523, a processor 524, a spindle/FM (feed motor) driver module 525, an analog front-end module 526, a write strategy module 527, and a DSP module 528.

The DVD control module 521 controls components of the DVDA 520 and communicates with an external device (not shown) via an I/O interface 529. The external device may include a computer, a multimedia device, a mobile computing device, etc. The I/O interface 529 may include wireline and/or wireless communication links.

The DVD control module 521 may receive data from the buffer 522, nonvolatile memory 523, the processor 524, the spindle/FM driver module 525, the analog front-end module 526, the write strategy module 527, the DSP module 528, and/or the I/O interface 529. The processor 524 may process the data, including encoding, decoding, filtering, and/or formatting. The DSP module 528 performs signal processing, such as video and/or audio coding/decoding. The processed data may be output to the buffer 522, nonvolatile memory 523, the processor 524, the spindle/FM driver module 525, the analog front-end module 526, the write strategy module 527, the DSP module 528, and/or the I/O interface 529.

The DVD control module 521 may use the buffer 522 and/or nonvolatile memory 523 to store data related to the control and operation of the DVD drive 518. The buffer 522 may include DRAM, SDRAM, etc. The nonvolatile memory 523 may include flash memory (including NAND and NOR flash memory), phase change memory, magnetic RAM, or multi-state memory, in which each memory cell has more than two states. The DVD PCB 519 includes a power supply 530 that provides power to the components of the DVD drive 518.

The DVDA 520 may include a preamplifier device 531, a laser driver 532, and an optical device 533, which may be an optical read/write (ORW) device or an optical read-only (OR) device. A spindle motor 534 rotates an optical storage medium 535, and a feed motor 536 actuates the optical device 533 relative to the optical storage medium 535.

When reading data from the optical storage medium 535, the laser driver provides a read power to the optical device 533. The optical device 533 detects data from the optical storage medium 535, and transmits the data to the preamplifier device 531. The analog front-end module 526 receives data from the preamplifier device 531 and performs such functions as filtering and A/D conversion. To write to the optical storage medium 535, the write strategy module 527 transmits power level and timing data to the laser driver 532. The laser driver 532 controls the optical device 533 to write data to the optical storage medium 535.

Figure 15D:
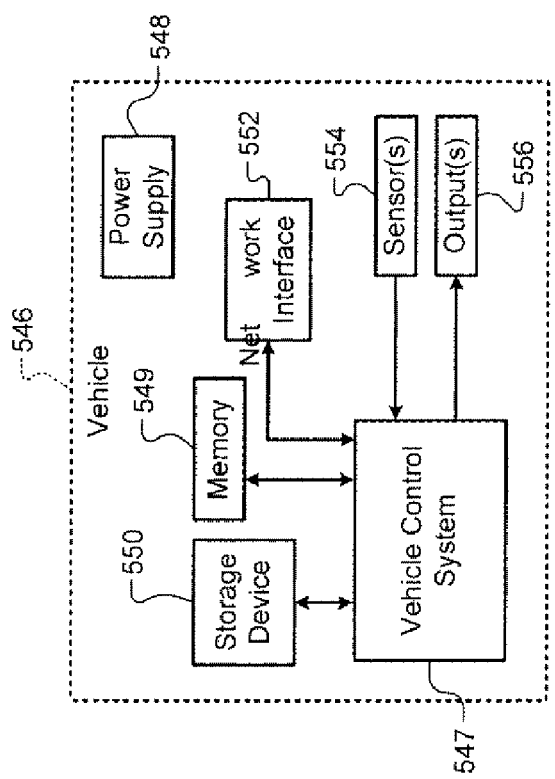
FIG. 15D is a functional block diagram of a vehicle control system.
Figure 15C:
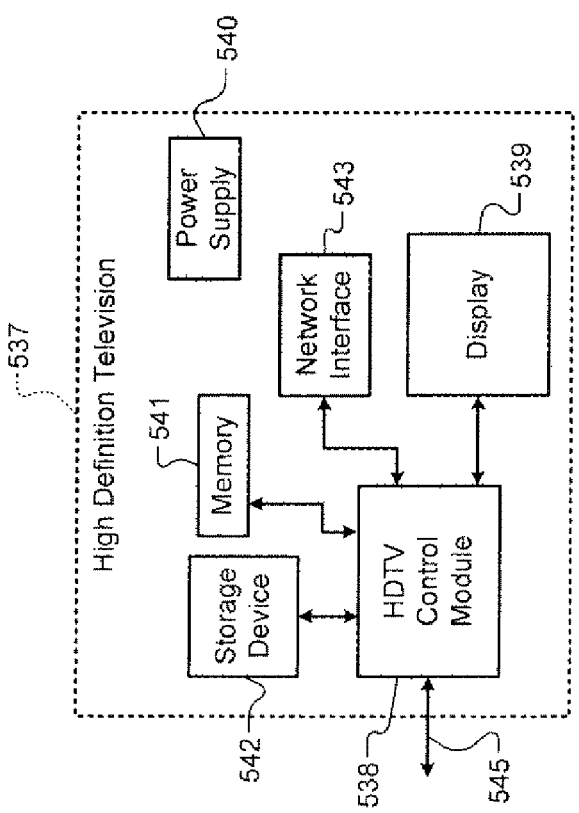
FIG. 15C is a functional block diagram of a high definition television.

Referring now to FIG. 15C, the teachings of the disclosure can be implemented in a control module of a high definition television (HDTV) 537 that communicates with memory and/or a storage device. The HDTV 537 includes the HDTV control module 538, a display 539, a power supply 540, the memory 541, the storage device 542, a network interface 543, and an external interface 545. If the network interface 543 includes a wireless local area network interface, an antenna (not shown) may be included.

The HDTV 537 can receive input signals from the network interface 543 and/or the external interface 545, which can send and receive data via cable, broadband Internet, and/or satellite. The HDTV control module 538 may process the input signals, including encoding, decoding, filtering, and/or formatting, and generate output signals. The output signals may be communicated to one or more of the display 539, memory 541, the storage device 542, the network interface 543, and the external interface 545.

Memory 541 may include random access memory (RAM) and/or nonvolatile memory such as flash memory, phase change memory, or multi-state memory, in which each memory cell has more than two states. The storage device 542 may include an optical storage drive, such as a DVD drive, and/or a hard disk drive (HDD). The HDTV control module 538 communicates externally via the network interface 543 and/or the external interface 545. The power supply 540 provides power to the components of the HDTV 537.

Referring now to FIG. 15D, the teachings of the disclosure may be implemented in a control system of a vehicle 546 that communicates with memory and/or a storage device. The vehicle 546 may include the vehicle control system 547, a power supply 548, the memory 549, the storage device 550, and a network interface 552. If the network interface 552 includes a wireless local area network interface, an antenna (not shown) may be included. The vehicle control system 547 may be a powertrain control system, a body control system, an entertainment control system, an anti-lock braking system (ABS), a navigation system, a telematics system, a lane departure system, an adaptive cruise control system, etc.

The vehicle control system 547 may communicate with one or more sensors 554 and generate one or more output signals 556. The sensors 554 may include temperature sensors, acceleration sensors, pressure sensors, rotational sensors, airflow sensors, etc. The output signals 556 may control engine operating parameters, transmission operating parameters, suspension parameters, etc.

The power supply 548 provides power to the components of the vehicle 546. The vehicle control system 547 may store data in memory 549 and/or the storage device 550. Memory 549 may include random access memory (RAM) and/or nonvolatile memory such as flash memory, phase change memory, or multi-state memory, in which each memory cell has more than two states. The storage device 550 may include an optical storage drive, such as a DVD drive, and/or a hard disk drive (HDD). The vehicle control system 547 may communicate externally using the network interface 552.

Figure 15F:
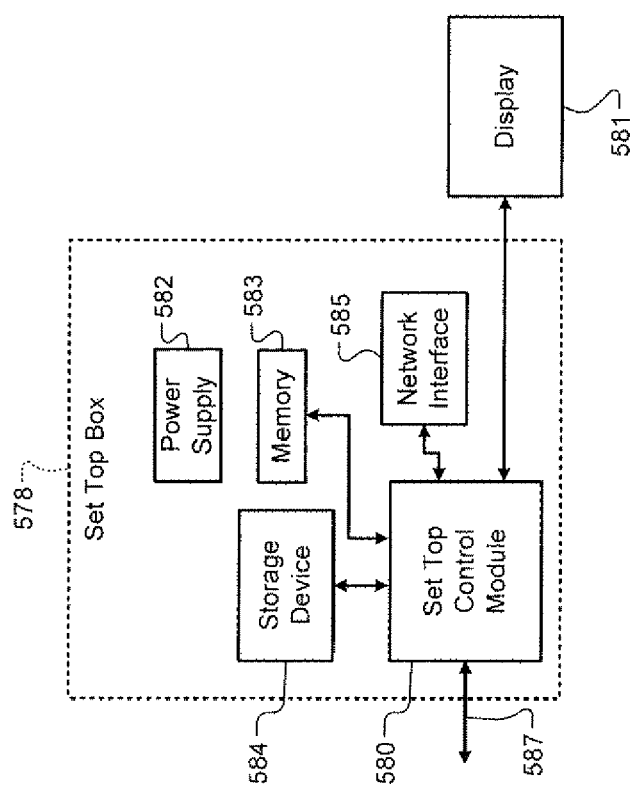
FIG. 15F is a functional block diagram of a set top box.
Figure 15E:
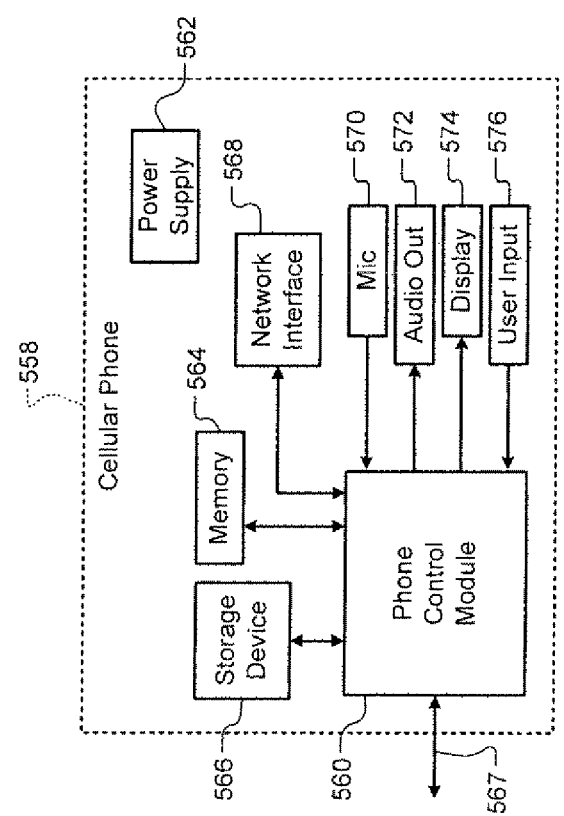
FIG. 15E is a functional block diagram of a cellular phone.

Referring now to FIG. 15E, the teachings of the disclosure can be implemented in a control module of a cellular phone 558 that communicates with memory and/or a storage device. The cellular phone 558 includes the phone control module 560, a power supply 562, the memory 564, the storage device 566, and a cellular network interface 567. The cellular phone 558 may include a network interface 568, a microphone 570, an audio output 572 such as a speaker and/or output jack, a display 574, and a user input device 576 such as a keypad and/or pointing device. If the network interface 568 includes a wireless local area network interface, an antenna (not shown) may be included.

The phone control module 560 may receive input signals from the cellular network interface 567, the network interface 568, the microphone 570, and/or the user input device 576. The phone control module 560 may process signals, including encoding, decoding, filtering, and/or formatting, and generate output signals. The output signals may be communicated to one or more of memory 564, the storage device 566, the cellular network interface 567, the network interface 568, and the audio output 572.

Memory 564 may include random access memory (RAM) and/or nonvolatile memory such as flash memory, phase change memory, or multi-state memory, in which each memory cell has more than two states. The storage device 566 may include an optical storage drive, such as a DVD drive, and/or a hard disk drive (HDD). The power supply 562 provides power to the components of the cellular phone 558.

Referring now to FIG. 15F, the teachings of the disclosure can be implemented in a control module of a set top box 578 that communicates with memory and/or a storage device. The set top box 578 includes the set top control module 580, a display 581, a power supply 582, the memory 583, the storage device 584, and a network interface 585. If the network interface 585 includes a wireless local area network interface, an antenna (not shown) may be included.

The set top control module 580 may receive input signals from the network interface 585 and an external interface 587, which can send and receive data via cable, broadband Internet, and/or satellite. The set top control module 580 may process signals, including encoding, decoding, filtering, and/or formatting, and generate output signals. The output signals may include audio and/or video signals in standard and/or high definition formats. The output signals may be communicated to the network interface 585 and/or to the display 581. The display 581 may include a television, a projector, and/or a monitor.

The power supply 582 provides power to the components of the set top box 578. Memory 583 may include random access memory (RAM) and/or nonvolatile memory such as flash memory, phase change memory, or multi-state memory, in which each memory cell has more than two states. The storage device 584 may include an optical storage drive, such as a DVD drive, and/or a hard disk drive (HDD).

Figure 15G:
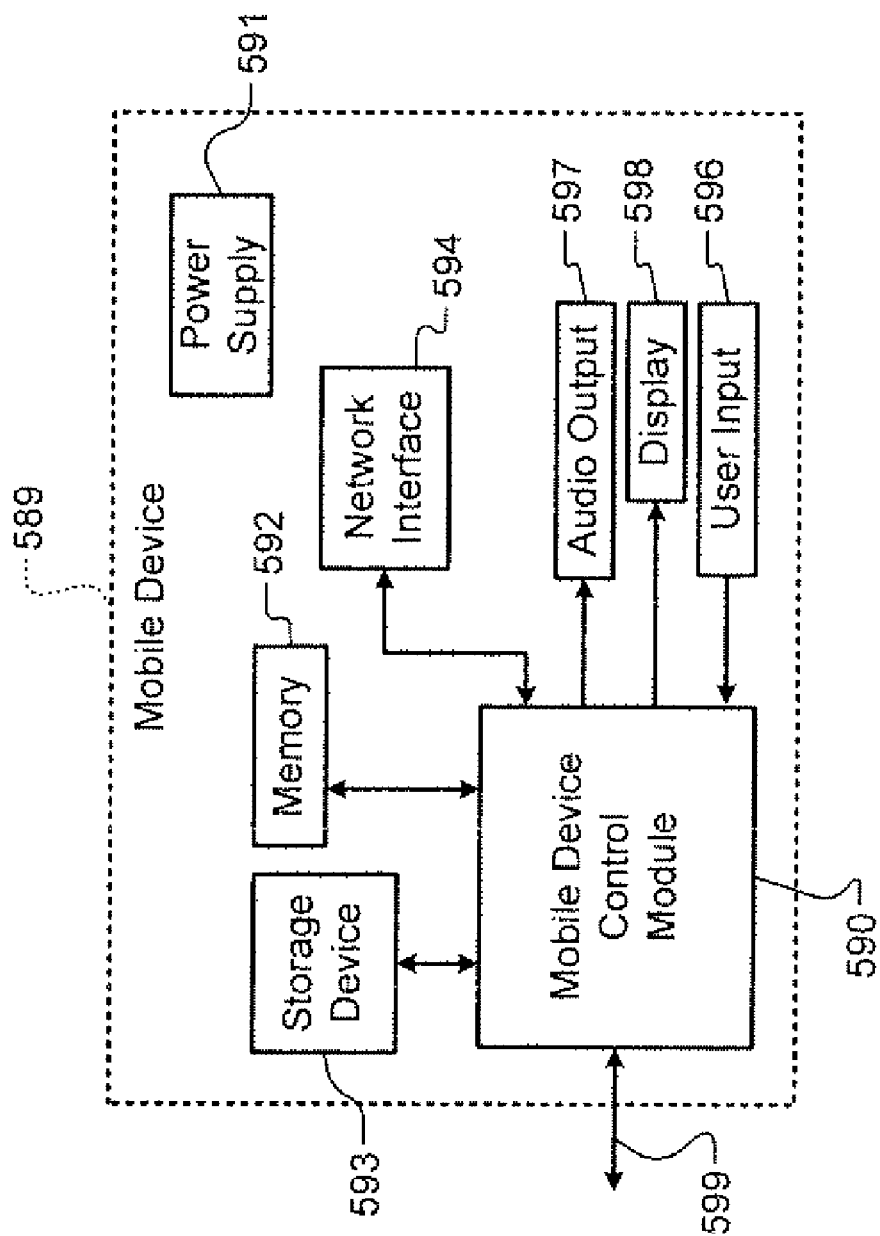
FIG. 15G is a functional block diagram of a mobile device.

Referring now to FIG. 15G, the teachings of the disclosure can be implemented in a control module of a mobile device 589 that communicates with memory and/or a storage device. The mobile device 589 may include the mobile device control module 590, a power supply 591, the memory 592, the storage device 593, a network interface 594, and an external interface 599. If the network interface 594 includes a wireless local area network interface, an antenna (not shown) may be included.

The mobile device control module 590 may receive input signals from the network interface 594 and/or the external interface 599. The external interface 599 may include USB, infrared, and/or Ethernet. The input signals may include compressed audio and/or video, and may be compliant with the MP3 format. Additionally, the mobile device control module 590 may receive input from a user input 596 such as a keypad, touchpad, or individual buttons. The mobile device control module 590 may process input signals, including encoding, decoding, filtering, and/or formatting, and generate output signals.

The mobile device control module 590 may output audio signals to an audio output 597 and video signals to a display 598. The audio output 597 may include a speaker and/or an output jack. The display 598 may present a graphical user interface, which may include menus, icons, etc. The power supply 591 provides power to the components of the mobile device 589. Memory 592 may include random access memory (RAM) and/or nonvolatile memory such as flash memory, phase change memory, or multi-state memory, in which each memory cell has more than two states. The storage device 593 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. An address decoder comprising:
   a plurality of predecoders configured to (i) receive and logically combine a clock signal and address signals, and (ii) generate addresses and complementary addresses, wherein at least one of the plurality of predecoders includes
   a first logic gate configured to receive the clock signal and one of the address signals, and
   a second logic gate configured to receive the clock signal and an output of the first logic gate; and
   a decoder configured to generate a decoder output based on the addresses and complementary addresses.

2. The address decoder of claim 1, wherein:
   the first logic gate comprises a first logic circuit configured to receive (i) the clock signal and (ii) the one of the address signals; and
   the second logic gate comprises a second logic circuit configured to receive (i) the clock signal and (ii) the output of the first logic gate.

3. The address decoder of claim 2, wherein the at least one of the plurality of predecoders further includes
   a first inverter configured to receive the output of the first logic gate, and
   a second inverter configured to receive an output of the second logic gate.

4. The address decoder of claim 2, wherein at least one of the first logic circuit and the second logic circuit comprises at least one of an AND gate and a NAND gate.

5. The address decoder of claim 1, wherein the decoder comprises
   a first logic circuit configured to receive the addresses and complementary addresses, and
   a second logic circuit configured to receive at least one of the addresses and complementary addresses not received by the first logic circuit.

6. The address decoder of claim 5, wherein the second logic circuit IS configured to cause the first logic circuit to provide a decoder output based on the addresses and complementary addresses.

7. The address decoder of claim 6, wherein the second logic circuit receives one of the addresses and complementary addresses.

8. The address decoder of claim 6, wherein the first logic circuit comprises a NOR gate, and the second logic circuit comprises a NAND gate.

9. The address decoder of claim 6, wherein the first logic circuit comprises:
   a plurality of transistors each comprising:
   first terminals,
   second terminals, and
   control terminals,
   wherein the control terminals receive at least one of the addresses and complementary addresses, and
   wherein the first terminals and the second terminals are connected in parallel between a first node and a second node, wherein the first node and the second node is at least one of a reference voltage potential and a source node of an evaluation transistor of the second logic circuit.

10. The address decoder of claim 9, further comprising an input transistor configured to (i) receive the clock signal and (ii) connect the first node to a supply voltage potential based on the clock signal.

11. The address decoder of claim 10, further comprising a charge maintaining transistor circuit configured to
    charge when the clock signal connects the first node to the supply voltage potential, and
    maintain the first node substantially at the supply voltage potential when the clock signal does not connect the first node to the supply voltage potential.

12. The address decoder of claim 9, wherein the plurality of transistors short the first node to at least one of the reference voltage potential and the source node of the evaluation transistor of the second logic circuit when an input to the control terminals of the plurality of transistors receives a first logic state.

13. The address decoder of claim 10, wherein the second logic circuit discharges the first node when the at least one of the addresses and complementary addresses corresponds to a first logic state.

14. The address decoder of claim 13, wherein the second logic circuit comprises an n-type transistor and a p-type transistor configured to (i) receive the at least one of the addresses and complementary addresses and (1i) communicate with a third node.

15. The address decoder of claim 14, further comprising an inverter in communication with the third node, wherein an output of the inverter corresponds to an output of the address decoder.

16. The address decoder of claim 14, wherein the second logic circuit comprises a p-type transistor configured to cause the third node to communicate with the supply voltage potential when the first node is at the first logic state.

17. The address decoder of claim 1, further comprising a plurality of the decoders configured to receive the addresses and complementary addresses, wherein one of the decoder and the plurality of the decoders outputs a first logic state.

18. A memory system comprising:
    the address decoder of claim 1;
    memory comprising a plurality of address locations, one of which corresponds to an output of the address decoder; and
    a memory control module configured to generate the address signals.

* * * * *